United States Patent
Tan

[19]

[11] Patent Number: 6,018,268
[45] Date of Patent: Jan. 25, 2000

[54] HIGH SPEED AND HIGH GAIN OPERATIONAL AMPLIFIER

[75] Inventor: Nianxiong Tan, Eatontown, N.J.

[73] Assignee: Telefonaktiebolaget LM Ericsson, Stockholm, Sweden

[21] Appl. No.: 09/111,866

[22] Filed: Jul. 8, 1998

[30] Foreign Application Priority Data

Jul. 8, 1997 [SE] Sweden ................................. 9702641

[51] Int. Cl.[7] ....................................................... H03F 3/45
[52] U.S. Cl. ........................................... 330/253; 330/259
[58] Field of Search ................................... 330/253, 258, 330/261, 259

[56] References Cited

U.S. PATENT DOCUMENTS

| | | | |
|---|---|---|---|
| 4,749,956 | 6/1988 | Torelli et al. | 330/253 |
| 4,820,998 | 4/1989 | Roessler et al. | 330/258 |
| 5,166,635 | 11/1992 | Shih | 330/253 |
| 5,319,316 | 6/1994 | Fensch | 330/253 |
| 5,428,316 | 6/1995 | Molnar | 330/253 |
| 5,434,538 | 7/1995 | Lee et al. | 330/84 |
| 5,491,447 | 2/1996 | Goetschel et al. | 330/254 |
| 5,589,785 | 12/1996 | Garavan | 327/63 |
| 5,604,464 | 2/1997 | Hwang et al. | 330/253 |
| 5,629,641 | 5/1997 | Cheng | 327/108 |
| 5,642,078 | 6/1997 | Navabi et al. | 330/259 |
| 5,668,468 | 9/1997 | Cargill | 330/258 |

FOREIGN PATENT DOCUMENTS

| | | |
|---|---|---|
| 0 295 221 | 12/1988 | European Pat. Off. |
| 0 325 299 | 7/1989 | European Pat. Off. |
| 95/23472 | 8/1995 | WIPO |

OTHER PUBLICATIONS

Kamath et al., "Relationship Between Frequency Response and Settling Time of Operational Amplifiers", IEE Journal of Solid–State Circuits, vol. sc–9, No. 6, pp. 347–352, Dec. 1974.

Primary Examiner—Robert Pascal
Assistant Examiner—Patricia T. Nguyen
Attorney, Agent, or Firm—Burns, Doane, Swecker & Mathis, L.L.P.

[57] ABSTRACT

The present invention relates to the design of high speed and high gain operational amplifiers for use in for example high performance switched-capacitor analog circuits. Increasing the gain without suffering the speed may be achieved by designing the amplifier as a single-stage operational tranconductance amplifier with single cascode for the N-type transistors (M8, M9) and double cascode for P-type transistors (M4, M5 and M10, M11). The invention may also comprise a continuous-time common-mode feedback. With this design of the invention, high speed and high gain can be maintained with a large phase margin to guarantee the stability.

7 Claims, 2 Drawing Sheets

HIGH SPEED AND HIGH GAIN OPERATIONAL AMPLIFIER

This application claims priority under 35 U.S.C. §§119 and/or 365 to 9702641-3 filed in Swenden on Jul. 8, 1997; the entire content of which is hereby incorporated by reference.

FIELD OF THE INVENTION

The present invention relates to the design of high speed and high gain operational amplifiers for the use in high performance switched-capacitor analog circuits, e.g., high performance analog-to-digital converters. Operational amplifiers are the most crucial building blocks of analog circuits. For high performance analog-to-digital converters in wideband radio systems the operational amplifiers set the limit of speed and accuracy.

BACKGROUND OF THE INVENTION

Operational amplifiers are the heart of most voltage-mode analog circuits. They usually dictate the operation speed and the accuracy of the switched-capacitor (SC) circuits. They also consume most of the power in the SC circuits. High performance analog-to-digital (A/D) converters usually use the SC circuit technique. Therefore, the performance of the operational amplifiers determines the performance of the A/D converters.

For the SC circuits, the load is purely capacitive. Usually single stage operational transconductance amplifiers (OTAs) are preferred over multi-stage operational amplifiers. In OTAs, the capacitive load is used to create the single dominant pole, which usually yields high unity-gain bandwidth. The DC gain is usually moderate but can be improved by cascoding. For multi-stage operational amplifiers, internal miller capacitors and sometimes resistors are used to split poles and introduce zeros to compensate for the phase lag and the frequency response can be independent of the load. However, the unity-gain bandwith is usually lower than the single-stage OTAs, though the DC gain is higher due to the cascading of more stages. For high speed A/D converters, usually single-stage architectures are preferred in that it is possible to achieve a single-pole settling and to have a very wide bandwidth. However, the gain is usually not enough for high accuracy A/D converters.

In for example the document U.S. Pat. No. 7,149,956 is shows a fully-differential operational amplifier for MOS integrator circuits, where the operational amplifier has one cascode transistor pair in the P-branch and one cascode transistor pair in the N-branch, see FIG. 5 in the said document.

SUMMARY OF THE INVENTION

The aim of the invention is to increase the gain without suffering the speed and that may be achieved by designing a high speed and high gain operational amplifier for the use in high performance switched-capacitor analog circuits, e.g., high performance analog-to-digital converters. The invented operational amplifier is a single-stage operational transconductance amplifier type with single cascode for the N-type transistors and double cascode for the P-type transistors. With reference to the cited document there should be a single-cascode in the N- and P-branches. The invention may also comprise a continuous-time common-mode feedback. With this design of the invention, high speed and high gain can be maintained with a large phase margin to guarantee the stability.

DETAILED DESCRIPTION OF THE PREFERRED EMBODIMENTS

Figure 1:
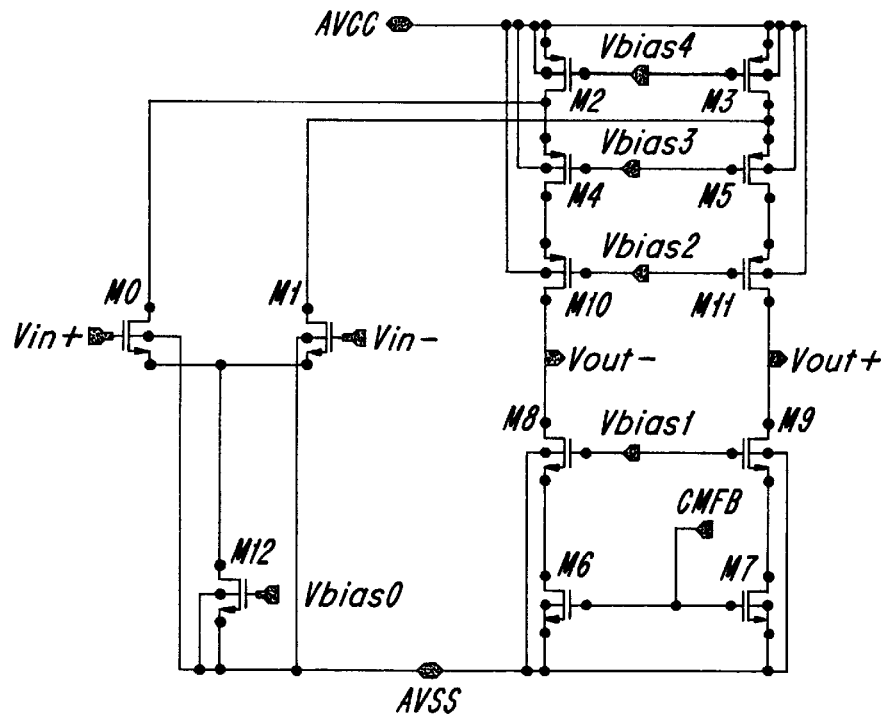
FIG. 1 is schematic view of the invented operational tranconductance amplifier OTA.

The operational amplifier shown in FIG. 1 is a folded-cascode OTA. Unlike conventional OTAs a double cascode is used in the P-branch to increase the gain without much speed penalty.

Transistors M0 and M1 are the input devices and a transistor M12 provides bias current for them. Input signals Vin+ and Vin− are applied to the gates of transistors M0 and M1, respectively. Transistors M2 and M3 are bias transistors for the P-branch. Transistors M4 and M5 are the first cascode transistor pair in the P-branch and transistors M10 and M11 are the second cascode transistor pair in the P-branch. Transistors M6 and M7 are bias transistors for the N-branch and at the same time they provide a means to control the common-mode component via a signal CMFB generated in a common-mode feedback circuit. Transistors M8 and M9 are the cascode transistor pair in the N-branch. Vout+ and Vout− are the fully differential outputs. Vbias0 is the bias voltage for transistor M12, Vbias1 is the bias voltage for transistors M8 and M9, Vbias2 is the bias voltage for transistors M10 and M11, Vbias3 is the bias voltage for transistors M4 and M5 and Vbias4 is the bias voltage for transistors M2 and M3. AVCC and AVSS are the supply voltages usually having values of 5 and 0V, respectively.

The invented operational amplifier shown in FIG. 1 is a single-stage OTA-type operational amplifier and the unity-gain bandwidth is given by:

$$f_u = \frac{1}{2\pi} \cdot \frac{g_{min}}{C_L},$$

where $g_{min}$ is the transconductance of the input transistors M0 and M1, and $C_L$ is the load capacitance of the OTA.

Suppose the frequence of the parasitic poles formed at the sources of the cascode transistors are considerably larger than the dominant pole frequence, a single-pole settling results. The settling error in unity-gain buffer configuration is given by B. Kamth, R. Meyer and P. Gray, "Relationship between frequency response and settling time of operational amplifiers", IEEE J. Solid-State Circuits, vol. SC-9. Dec. 1974, pp. 347–352 by:

$$\frac{\Delta V}{V} = \frac{A_{DC}}{1 + A_{DC}} \cdot \exp(-2\pi \cdot f_u \cdot t),$$

where $A_{DC}$ is the DC gain of the operational amplifier. Suppose a 12-bit accuracy is needed. The operational amplifier needs to settling within a half clock sampling period with a 12-bit accuracy and the relation will be:

$$\exp(-2\pi \cdot f_u \cdot t) < \frac{2^{-12}}{2},$$

and thus:

$$f_u > \frac{1.4}{t} = \frac{1.4}{0.5T} = \frac{2.8}{T} = 2.8 \cdot f_{sample},$$

where T is the sampling period and $f_{sample}$ is the sampling frequency. The unity gain bandwidth must be three times larger than the sample frequence to guarantee a 12-bit settling accuracy.

Considering the parasitic poles and the different surroundings for the OTA during different clock phases, there will be required that the unity-gain bandwidth will be at least six times larger than the sample frequency. Suppose a sampling frequence of 50 Mhz, then the unity-gain bandwidth should be over 300 Mhz.

The smaller the load capacitance is, the larger unity-gain bandwidth will be. However, there are two adverse effects of using small load capacitance. The thermal noise power and other noise power is inversely proportional to the sampling capacitance. Also the non-dominant poles can decrease the phase margin, if the non dominant poles are not so far apart from the dominant pole that is inversely proportional to the load capacitance. Therefore the load capacitance will be chosen 2~4 pF. With this large sampling capacitance, the thermal noise does not limit the dynamic range of 12 bite if the peal input signal is larger than 0.5 V.

As a general rule, the phase margin should be larger than 45 deg for SC applications. With this large load capacitance, the phase margin is easy to guarantee.

The accuracy is directly related with the DC gain of the OTA and its capacitive surroundings. Suppose a 12-bit accuracy is needed, a rough estimation of DC gain is given by:

$$A_{DC} > 2 \cdot 2^{12} = 78 \text{ dB}.$$

Considering the design margin, the DC gain is required to be larger than: 78+3 =81 dB. To achieve this high gain, it is necessary to use cascode technique. Since the gain and output resistance of a PMOS transistor is considerably smaller than the gain and output resistance of an NMOS transistor, double cascodes are used for the upper branch as shown in FIG. 1. The DC gain is given by:

$$A_{DC} \approx g_{min}(r_{o6} \cdot A_{M8} \| r_{o2} \cdot A_{M4} \cdot A_{M10}),$$

where $r_{o6}$ and the $r_{o2}$ are the output resistance of the transistors M6 and M2, respectively, $A_{M8}$, $A_{M4}$ and $A_{M10}$ are the gain of the transistors M8, M4 and M10, respectively. The drawback is the limited output voltage range. However, it is of benefit to reduce the voltage swing to reduce distortion due to the sampling. Since the mobility in MOS transistors is more than 4 times larger than that in PMOS transistors in certain available CMOS process, it is a good choice to design the common-mode voltage as low as possible to reduce the switch-on resistance of NMOS switches. The common-mode voltage is set to be 2V. The output voltage can awing more than +/−1.2V without degradation in performance.

Figure 2:
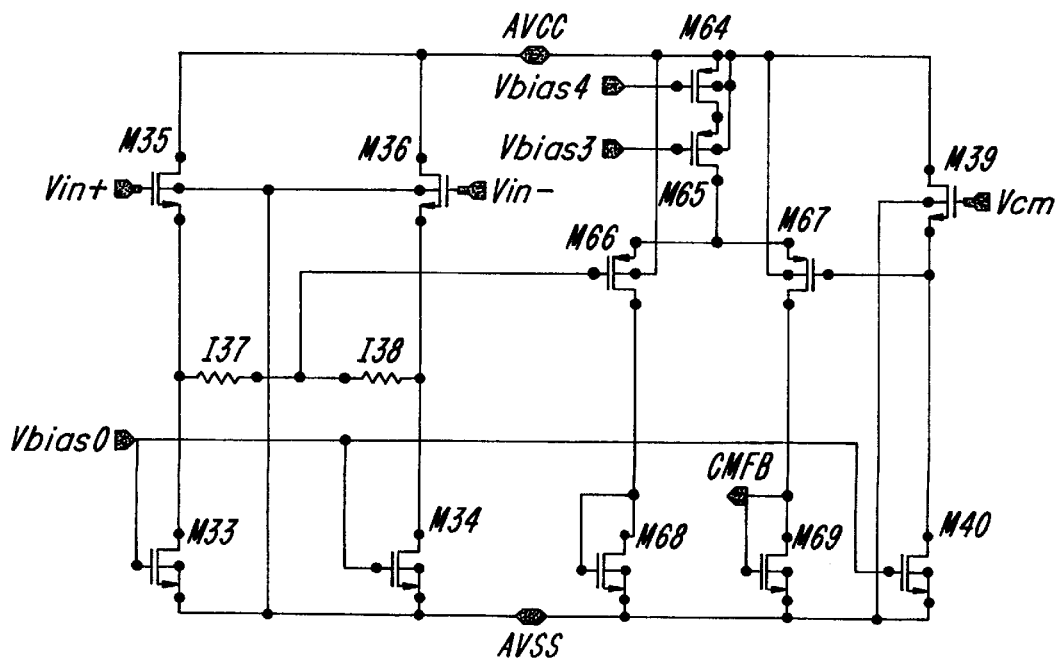
FIG. 2 is a schematic view of the common-mode feedback circuit according to the embodiment.

Shown in FIG. 2 is the common-mode feedback circuit. Transistors M35 and M36 are the input devices of the common-mode feedback circuit and their gates are connected with the input voltages Vin+ and Vin−, respectively, which are the fully-differential outputs Vout+ and Vout− of the operational amplifier of FIG. 1. Transistors M33 and M34 provide bias currents for the input devices M35 and M36. Resistors I37 and I38 are used to generate the common-mode voltage in the fully differential input voltages at the gate of transistor M66. Noticeable is that the common-mode voltage is level-shifted due to the gate-source voltage of transistors M35 and M36. The common-mode input voltage Vcm is applied to the gate of transistor M67 via transistor M39 and level-shifted by the gate-source voltage of transistor M39. Transistor M40 provides the bias current for transistor M39. The difference between the voltages applied at the differential pair M66 and M67 i.e., the level-shifted common-mode voltage in the fully differential signals and the level-shifted common-mode input voltage is used to generate the common-mode control signal CMFB used in the operational amplifier of FIG. 1. Transistors M68 and M69 are the loads for the differential transistor pair M66 and M67 and the current in transistor M69 is used to control the common-mode voltage in the operational amplifier of FIG. 1 via the signal CMFB. Transistor M64 is the bias transistor for the differential pair M66 and M67 and transistor M65 is the cascode transistor for transistor M64. Vbias0 is the bias voltage for transistors M33, M34, and M40, Vbias3 is the bias voltage for transistor M65, and Vbias4 is the bias voltage for transistor M64. AVCC and AVSS are the supply voltages having values of 5 and 0V, respectively.

Figure 3:
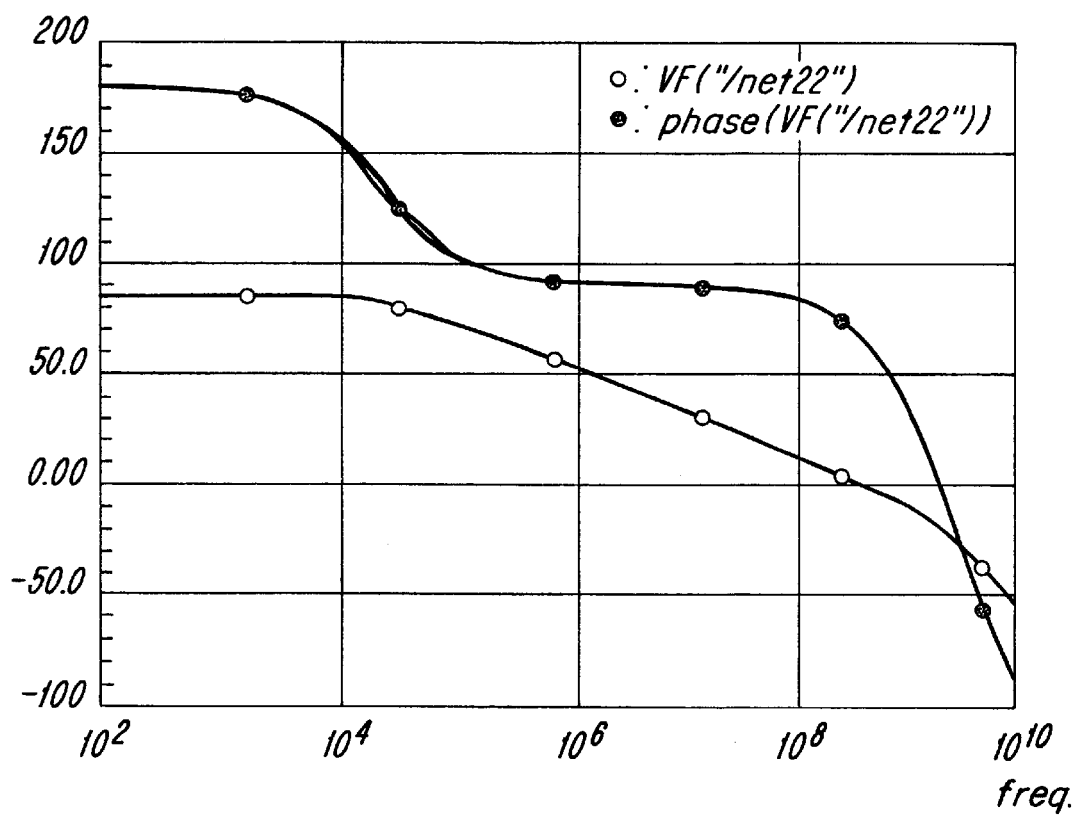
FIG. 3 shows a simulated frequency response of the OTA according to the invention.

To verify the performance a SPICE simulation is carried out within the CADENCE platform. An optimization of DC operation points is prioritized to make the circuit less sensitive to process variation. The optimization is carried out in such a way that there is enough source-drain voltage to guarantee all the transistors in saturation region even when there is a considerable change in threshold voltage and transistor dimension. The simulation result is shown in FIG. 3, where both the amplitude and the phase response are shown.

To check the robustness of the circuit the bias current is varied by 20%, and both the input and the output common-mode voltage are varied from 1.8 to 2V. Under all these variations, the DC gain is larger than 83 dB, the unity gain bandwidth is larger than 400 Mhz, and the phase margin is around 60 deg with a 4-pF capacitance, as seen in FIG. 3. The performance of the OTA is summarized in table 1.

While the foregoing description includes numerous details and specificities, it is to be understood that these are merely illustrative of the present invention, and are not to be construed as limitations. Many modifications will be readily apparent to those skilled in the art, which do not depart from the spirit and the scope of the invention, as defined by the appended claims and their legal equivalents.

TABLE 1

Summary of the performance of the OTA

|  | 2-pF capacitive load | 4-pF capacitive load |
| --- | --- | --- |
| power dissipation @ 5 V | 25 mW | 25 mW |
| DC gain (dB) | 85 dB | 85 dB |
| Unity-gain bandwidth | 750 MHz | 420 MHz |
| Phase, margin | 49 deg | 66 deg |
| Slew rate (positive transition) | 340 V/us | 180 V/us |
| Slew rate (negative transition) | 530 V/us | 270 V/us |
| CMRR (matched) | >100 dB | >100 dB |
| PSSR (positive supply) | 66 dB | 66 dB |
| PSRR (negative supply) | 69 dB | 69 dB |

I claim:

1. A method for operating an asymmetrical cascode in a folded-cascode operational amplifier architecture used in high performance switched-capacitor analog circuits wherein said architecture includes an N-branch comprising NMOS transistors and a P-branch comprising PMOS transistors, said method comprising the steps of:

generating a control signal by operation of an NMOS current source transistor pair located in a single cascode NMOS current source pair within said architecture, wherein the control signal contains information of a common mode component in differential output signals; and employing an additional cascode device in said P-branch in said architecture.

2. The method of claim 1, further comprising the step of:
generating a bias voltage for said single cascode NMOS current source pair.

3. The method of claim 1, wherein said architecture is an inverted operational amplifier.

4. A device for using asymmetrical cascode in a folded-cascode operational amplifier, wherein said architecture includes an N-branch and a P branch, comprising:

an NMOS transistor pair receiving input signals;

a double-cascode arrangement of PMOS transistor pairs receiving said signals from said NMOS transistor pair;

a single cascode arrangement of NMOS transistor pairs receiving said signals from said double cascode arrangement of PMOS transistor pairs and outputting fully differential output signals, wherein each of said NMOS transistor pairs comprises a current source transistor pair which is biased by a control signal;

an NMOS transistor which provides a bias current for said NMOS transistor pair; and a PMOS transistor pair which provides a bias current for said double cascode arrangement of PMOS transistor pairs.

5. A device for generating a control signal for an NMOS current source transistor pair in a single cascode NMOS current source pair comprising:

a folded cascode operational amplifier outputting fully differential signals;

an NMOS pair receiving said fully differential signals;

a resistor pair used to generate a signal that is proportional to the sum of the fully differential signals applied to the NMOS pair;

a single NMOS transistor for generating a level shifted common mode reference signal;

a PMOS pair for receiving said signal and said level shifted common mode reference signal; and a load for said PMOS pair further comprising two diode connected NMOS transistors, wherein a control signal is generated at a drain of one of said NMOS transistors.

6. The device of claim 5, further comprising:

a second NMOS transistor pair for providing a bias current to said NMOS transistor pair;

an NMOS transistor for providing a bias current to said single NMOS transistor; and PMOS transistors provided to form a cascode current source and provide the bias current for said PMOS pair.

7. The device of claim 5, wherein said level shifted common mode reference signal is the difference between voltages applied at said PMOS pair.

* * * * *